(12) United States Patent
Capewell et al.

(10) Patent No.: US 7,179,727 B2
(45) Date of Patent: Feb. 20, 2007

(54) FORMATION OF LATTICE-TUNING SEMICONDUCTOR SUBSTRATES

(75) Inventors: Adam Daniel Capewell, Leamington Spa (GB); Timothy John Grasby, Worcestershire (GB); Evan Hubert Cresswell Parker, Gloucestershire (GB); Terence Whall, Worcestershire (GB)

(73) Assignee: AdvanceSis Limited (GB)

( * ) Notice: Subject to any disclaimer, the term of this patent is extended or adjusted under 35 U.S.C. 154(b) by 37 days.

(21) Appl. No.: 10/525,987

(22) PCT Filed: Aug. 12, 2003

(86) PCT No.: PCT/GB03/03514

§ 371 (c)(1),
(2), (4) Date: Mar. 1, 2005

(87) PCT Pub. No.: WO2004/023536

PCT Pub. Date: Mar. 18, 2004

(65) Prior Publication Data

US 2005/0245055 A1 Nov. 3, 2005

(30) Foreign Application Priority Data

Sep. 3, 2002 (GB) .................................. 0220438.6

(51) Int. Cl.
*H01L 21/20* (2006.01)
(52) U.S. Cl. ...................... 438/490; 438/488; 438/489; 438/492; 438/493; 438/496; 438/602; 438/603; 438/604; 438/933
(58) Field of Classification Search ........ 438/488–490, 438/492, 493, 496, 602–604, 933
See application file for complete search history.

(56) References Cited

U.S. PATENT DOCUMENTS 5,108,947 A 4/1992 Demeester et al.

(Continued)

FOREIGN PATENT DOCUMENTS

EP 1 052 684 A1 11/2000

(Continued)

OTHER PUBLICATIONS

"Molecular beam epitaxy of strained $Si_{1-x}Ge_x$ layers on patterned substrates" Jun. 1, 1993, Journal of Crystal Growth, North-Holland Publishing Co., vol. 130, Nos. 3/4, pp. 611-616, Bugiel et al.

*Primary Examiner*—Zandra V. Smith
*Assistant Examiner*—Bac H. Au
(74) *Attorney, Agent, or Firm*—Squire, Sanders & Dempsey LLP

(57) ABSTRACT

A method of forming a lattice-tuning semiconductor substrate comprises the steps of defining parallel strips of a Si surface by the provision of spaced parallel oxide walls (2) on the surface, selectively growing a first SiGe layer on the strips such that first dislocations (3) extend preferentially across the first SiGe layer between the walls (2) to relieve the strain in the first SiGe layer in directions transverse to the walls (2), and growing a second SiGe layer on top of the first SiGe layer to overgrow the walls (2) such that second dislocations form preferentially within the second SiGe layer above the walls (2) to relieve the strain in the second SiGe layer in directions transverse to the first dislocations (3). The dislocations so produced serve to relax the material in two mutually transverse directions whilst being spatially separated so that the two sets of dislocations cannot interact with one another. Thus the density of threading dislocations and the surface roughness is greatly reduced, thus enhancing the performance of the virtual substrate by decreasing the disruption of the atomic lattice that can lead to scattering of electrons in the active devices and degradation of the speed of movement of the electrons.

26 Claims, 2 Drawing Sheets

U.S. PATENT DOCUMENTS

Figure 1:
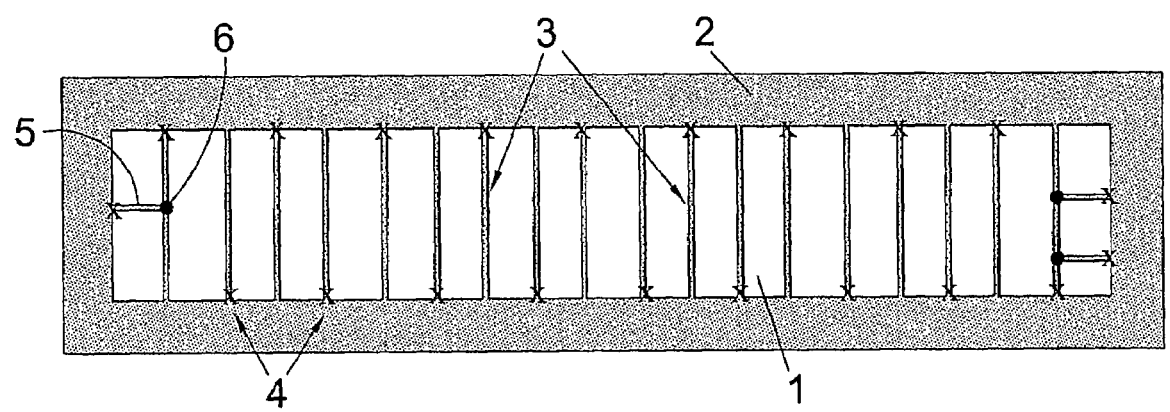
Figure 2A:
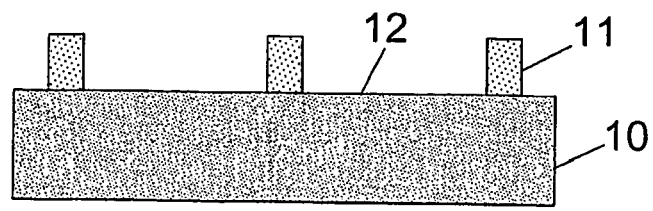
Figure 2B:
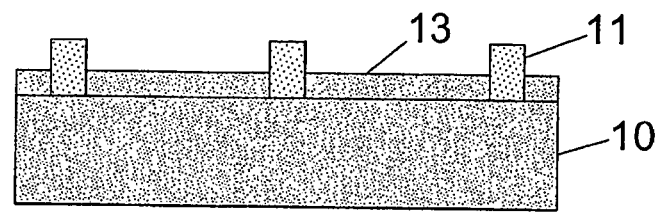
Figure 2C:
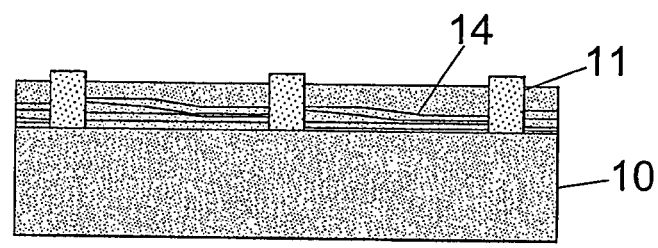
Figure 2D:
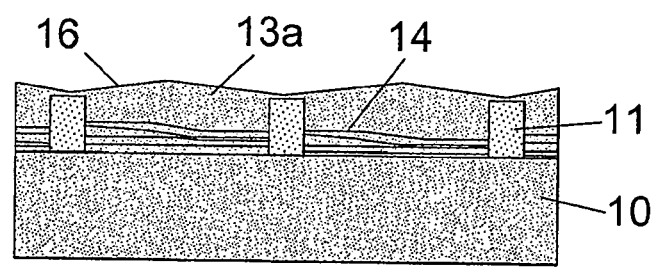
Figure 2E:
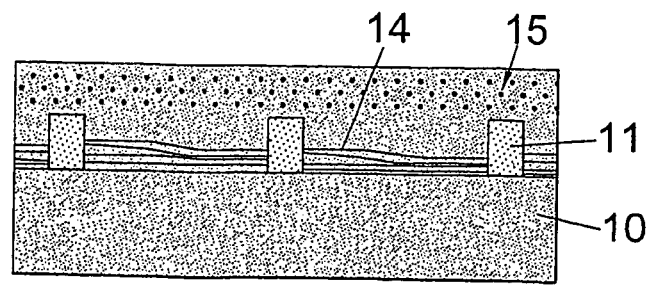

| | | | |
|---|---|---|---|
| 5,158,907 A * | 10/1992 | Fitzgerald, Jr. | 438/504 |
| 5,238,869 A | 8/1993 | Shichijo et al. | |
| 5,272,105 A | 12/1993 | Yacobi et al. | |
| 5,410,167 A | 4/1995 | Saito | |
| 5,442,205 A * | 8/1995 | Brasen et al. | 257/191 |
| 2002/0017642 A1 | 2/2002 | Mizushima et al. | |

FOREIGN PATENT DOCUMENTS

| | | |
|---|---|---|
| GB | 2 215 514 | 9/1989 |
| WO | WO 99/14804 | 3/1999 |
| WO | WO 99/38201 | 7/1999 |
| WO | WO 01/01465 | 1/2001 |

\* cited by examiner

FORMATION OF LATTICE-TUNING SEMICONDUCTOR SUBSTRATES

This invention relates to the production of lattice-tuning semiconductor substrates, and is more particularly, but not exclusively, concerned with the production of relaxed SiGe (silicon/germanium) "virtual substrates" suitable for the growth of strained silicon or SiGe active layers and unstrained III–V semiconductor active layers within which active semiconductor devices, such as MOSFETs, may be fabricated.

It is known to epitaxially grow a strained Si layer on a Si wafer with a relaxed SiGe buffer layer interposed therebetween, and to fabricate semiconductor devices, such as MOSFETs, within the strained Si layer in order to enhance the properties of the semiconductor devices. The buffer layer is provided in order to increase the lattice spacing relative to the lattice spacing of the underlying Si substrate, and is generally called a virtual substrate.

It is known to epitaxially grow an alloy of silicon and germanium (SiGe) on the silicon substrate to form the buffer layer. Since the lattice spacing of SiGe is greater than the normal lattice spacing of Si, the desired increase in lattice spacing is achieved by the provision of such a buffer layer if the buffer layer is allowed to relax.

The relaxation of the buffer layer inevitably involves the production of dislocations in the buffer layer to relieve the strain. These dislocations generally form a half loop from the underlying surface which expands to form a long dislocation at the strained interface. However the production of threading dislocations which extend through the depth of the buffer layer is detrimental to the quality of the substrate, in that such dislocations can produce an uneven surface and can cause scattering of electrons within the active semiconductor devices. Furthermore, since many dislocations are required to relieve the strain in a SiGe layer, such dislocations inevitably interact with one another causing pinning of threading dislocations. Additionally more dislocations are required for further relaxation, and this can result in a higher density of threading dislocations.

Known techniques for producing such a buffer layer, such as are disclosed in U.S. Pat. No. 5,442,205, U.S. Pat. No. 5,221,413, WO 98/00857 and JP 6-252046, involve linearly grading the Ge composition in the layer in order that the strained interfaces are distributed over the graded region. This means that the dislocations that form are also distributed over the graded region and are therefore less likely to interact. However such techniques suffer from the fact that the main sources of dislocations are multiplication mechanisms in which many dislocations are generated from the same source, and this causes the dislocations to be clustered in groups, generally on the same atomic glide planes. The strain fields from these groups of dislocations can cause the virtual substrate surface to have large undulations which is both detrimental to the quality of the virtual substrate and has the added effect of trapping threading dislocations.

U.S. 2002/0017642A1 describes a technique in which the buffer layer is formed from a plurality of laminated layers comprising alternating layers of a graded SiGe layer having a Ge composition ratio which gradually increases from the Ge composition ratio of the material on which it is formed to an increased level, and a uniform SiGe layer on top of the graded SiGe layer having a Ge composition ratio at the increased level which is substantially constant across the layer. The provision of such alternating graded and uniform SiGe layers providing stepped variation in the Ge composition ratio across the buffer layer makes it easier for dislocations to propagate in lateral directions at the interfaces, and consequently makes it less likely that threading dislocations will occur, thus tending to provide less surface roughness. However this technique requires the provision of relatively thick, carefully graded alternating layers in order to provide satisfactory performance, and even then can still suffer performance degradation due to the build-up of threading dislocations.

It is an object of the invention to provide a method of forming a lattice-tuning semiconductor substrate in which performance is enhanced by decreasing the density of threading dislocations as compared with known techniques.

According to the present invention there is provided a method of forming a lattice-tuning semiconductor substrate, comprising:

(a) defining parallel strips of a Si surface by spaced parallel isolating means;

(b) selectively growing a first SiGe layer on the strips such that first dislocations extend preferentially across the first SiGe layer between the isolating means to relieve the strain in the first SiGe layer in directions transverse to the isolating means; and (c) growing a second SiGe layer on top of the first SiGe layer to overgrow the isolating means such that second dislocations form preferentially within the second SiGe layer above the isolating means to relieve the strain in the second SiGe layer in directions transverse to the first dislocations.

It is believed that such a technique is capable of producing high quality SiGe virtual substrates with extremely low levels of threading dislocations, that is with levels from less than $10^6$ dislocations per $cm^2$ to virtually no threading dislocations. This is as a result of the fact that dislocations are produced which serve to relax the SiGe material in two mutually transverse directions whilst being spatially separated so that the two sets of dislocations cannot interact with one another in such a manner as to produce threading dislocations extending through the depth of the SiGe material.

As a result a thinner virtual substrate can be produced for a given Ge composition with both the threading dislocation density and the surface undulations being very greatly reduced. This results in a virtual substrate which is superior and allows power to be more readily dissipated. The decrease in roughness of the surface of the virtual substrate renders further processing more straightforward in that polishing of the surface can be minimised or dispensed with altogether, and loss of definition due to unevenness of the surface is minimised. The quality of the virtual substrate produced may be such as to render it suitable for specialised applications, for example in microelectronics or in full CMOS integration systems.

In order that the invention may be more fully understood, reference will now be made to the accompanying drawings, in which:

FIG. 1 is an explanatory view showing the effect of the transverse dislocations in preventing relaxation of a strained Si substrate in the longitudinal direction; and FIG. 2 shows successive steps in a method of forming a lattice-tuning semiconductor substrate in accordance with the invention.

The following description is directed to the formation of a virtual lattice-tuning Si substrate on an underlying Si substrate with the interposition of a SiGe buffer layer. However it should be appreciated that the invention is also applicable to the production of other types of lattice-tuning semiconductor substrates, including substrates terminating at fully relaxed pure Ge allowing III–V incorporation with silicon. It is also possible in accordance with the invention to incorporate one or more surfactants, such as antimony for example, in the epitaxial growth process in order to produce even smoother virtual substrate surfaces and lower density threading dislocations by reducing surface energy.

FIG. 1 shows a long thin stripe of SiGe material 1 which is grown within a confined area between Si oxide walls 2 which surround the SiGe material on four sides. During the growth of the layer of SiGe within this area by epitaxial growth, dislocations 3 form preferentially along the shortest dimension of the area, that is from one long oxide wall towards the other opposite, long oxide wall. These dislocations 3 are generated at dislocation nucleation sites 4 along one or other of the long oxide walls, as illustrated in each case by a "X" in the figure. This is generally attributed to the ease of dislocation formation at the edge of the growth zone. Where dislocations are formed along the shortest dimension, these dislocations are able to extend to the opposite edge of the zone substantially unhindered. However, dislocations tending to form along the longest dimension of the zone are quickly blocked by the dislocations formed along the shortest dimension, and thus cannot traverse the entire length of the zone. Such dislocations 5 are shown in FIG. 1 as being generated from one end of the zone but being quickly pinned at pinning locations 6 by the dislocations 3 extending along the shortest dimension.

Consequently the SiGe material in this case can only be relaxed in one direction by the formation of the dislocations extending along the shortest dimension, whilst remaining unrelaxed in the orthogonal direction due to the failure of dislocations to form along the longest dimension (although there may be some elastic relaxation if the shortest dimension is small enough). Whilst the above described difficulties are discussed above in relation to growth of SiGe within a limited area confined by oxide walls 2, similar problems are found where SiGe is required to be grown within an area limited by the area of the substrate surface, for example on top of an etched mesa pillar.

Accordingly, in accordance with a method of the invention for forming a relaxed SiGe virtual substrate suitable for growth of strained Si or SiGe active layers and unstrained III–V semiconductor active layers within which active semiconductor devices, such as MOSFETs, may be fabricated, a layer of oxide is grown on a Si substrate 10 and is then selectively etched after the area to be etched has been defined, for example by the application of a photoresist layer to the oxide layer and the selective exposure and development of the photoresist layer to form a photoresist mask. After etching elongate walls 11 of oxide extend substantially parallel to one another along the length of the substrate 10 and are separated by long thin strips 12, as shown at a in FIG. 2, within which a SiGe layer may subsequently be grown in the manner already described above.

In the subsequent epitaxial growth process a SiGe layer 13 is selectively grown on each long thin strip 12 between the oxide walls 11, as shown at b in FIG. 2, at a temperature in the range from room temperature to 1200° C., and preferably in the range from 350 to 900° C. Such SiGe growth is selective such that there is substantially no growth of SiGe along the top of the oxide walls 11. Such selective growth may be effected by chemical vapour deposition (CVD).

As indicated at c in FIG. 2 dislocations 14 are caused to be generated at each oxide wall 11 and to extend along the shortest dimension towards the opposite oxide wall 11. In this manner the SiGe material is caused to relax in the direction of the dislocations 14 which extend over the entire width of the area between the walls 11.

Subsequent to such relaxation, which may be assisted by an annealing step if required carried out at an elevated temperature in the range from room temperature to 1500° C., and preferably in the range from 500 to 1,200° C., epitaxial growth of SiGe material is continued at a temperature in the range from room temperature to 1200° C., and preferably in the range from 350 to 900° C., to form a further SiGe layer 13a continuous with the first SiGe layer 13 until lateral overgrowth of the SiGe material onto the top of the oxide walls 11 occurs, as shown at d in FIG. 2. Eventually the grown areas of SiGe seeded in the areas between the oxide walls 11 will coalesce with each other and cover the entire surface of the Si substrate. The SiGe material grown in this manner may form a single crystalline layer, or alternatively there may be stacking faults where the different growth zones coalesce. It is in any case likely that the surface will be uneven where the different growth zones meet.

As the growth of the SiGe material continues, the strain in the unrelieved longitudinal direction is eventually relaxed by the formation of dislocations extending in the longitudinal direction which are able to be nucleated from anywhere on the wafer. Since such nucleation has a much higher activation energy than nucleation from the oxide walls on the sides of the growth zone, the formation of such longitudinal dislocations 15 occurs at a much later stage than the formation of the dislocations 14 within the windows defined by the oxide walls 11.

As the longitudinal dislocations 15 are formed at a higher level than the dislocations 14 within the windows, the two sets of dislocations 13, 15 do not interact with one another and the dislocations may extend over the whole surface of the wafer. Furthermore, because there is no strain in the SiGe material in a direction orthogonal to the outside walls 11, there will be no driving force tending to produce dislocations in this direction. Furthermore, since any dislocation interactions are kept to a minimum, there are substantially no threading dislocations produced which would otherwise terminate at the upper surface of the SiGe material resulting in roughness of the surface.

In this manner a high quality virtual substrate is produced which may be used for the growth of strained Si or SiGe active layers and unstrained III–V semiconductor active layers within which active semiconductor devices may be fabricated.

In the above described method the height of the oxide walls 11 may vary from 10 nm to 1,000 nm depending on the Ge composition of the SiGe material, although it would normally be expected to be in the range of 400 nm to 700 nm. The oxide windows may range in width from 100 nm to 100 μm in width, and most likely are from 5 μm to 20 μm in width. The width of the oxide walls 11 is preferably as small as possible to ensure full lateral overgrowth, and currently the width is likely to be in the range from 100 nm to 10 μm, and preferably about 1 μm.

The Ge composition within the SiGe material may be substantially constant through the thickness of the layer, although it would also be possible for the Ge composition to be graded so that it increases from a first composition at a lower level in the layer to a second, higher composition at a higher level in the layer.

Various modifications of the above-described method are possible within the scope of the invention. For example, after sufficient growth of the SiGe material has taken place to provide overgrowth of the tops of the oxide walls 11, an uneven surface 16 may be obtained, as shown at d in FIG.

2, and the effect of this may be overcome by a chemo-mechanical polishing (CMP) step to planarise the surface before a final capping layer is grown to obtain the final arrangement shown at e in FIG. 2. In a further modification, an annealing step is applied to ensure full relaxation. Such an annealing step may be effected at any stage in the SiGe growth process, although it is preferably effected after the selective SiGe growth between the oxide walls 11 and before the further growth leading to overgrowth of the oxide walls 11.

In a further modification, instead of the SiGe material being grown between oxide walls, the SiGe growth occurs on top of closely spaced mesa pillars defining the growth zones. In this case the isolation between the strips is provided by the trenches between the pillars, rather than by isolating oxide walls, and the epitaxial growth process may be molecular beam epitaxy (MBE) or CVD. As a further alternative the SiGe material may be grown between spaced parallel walls of Si nitride or some other isolating material.

Furthermore the virtual substrate may be epitaxially grown on a patterned silicon wafer or a wafer having a patterned oxide layer such that growth only occurs in selected areas. Thus the fabrication technique may be used to produce a virtual substrate in only one or more selected areas of the chip (as may be required for system-on-a-chip integration) in which enhanced circuit functionality is required, for example.

The method of the invention is capable of a wide range of applications, including the provision of a virtual substrate for the growth of strained or relaxed Si, Ge or SiGe layers for fabrication of devices such as bipolar junction transistors (BJT), field effect transistors (FET) and resonance tunnelling diodes (RTD), as well as III–V semiconductor layers for high speed digital interface to CMOS technologies and optoelectronic applications including light emitting diodes (LEDs) and semiconductor lasers.

The invention claimed is:

1. A method of forming a lattice-tuning semiconductor substrate, comprising:
   (a) defining parallel strips (12) of a Si surface by spaced parallel isolating means (2; 11) provided along opposite edges of the strips;
   (b) selectively growing a first SiGe layer (13) on the strips (12) and not on the isolating means (2; 11) between the strips, such that first dislocations (14) extend across the first SiGe layer (13) between the isolating means (2; 11) to relieve the strain in the first SiGe layer (13) in directions transverse to the isolating means (2; 11); and
   (c) growing a second SiGe layer (13a) on top of the first SiGe layer (13) to overgrow the isolating means (2; 11) such that second dislocations (15) form within the second SiGe layer (13a) above the isolating means (2; 11) to relieve the strain in the second SiGe layer (13a) in directions transverse to the first dislocations (14).

2. A method according to claim 1, wherein the first SiGe layer (13) has a Ge composition ratio that is substantially constant within the layer (13).

3. A method according to claim 1, wherein the second SiGe layer (13a) has a Ge composition ratio that is substantially constant within the layer (13a).

4. A method according to claim 1, wherein at least one of the SiGe layers (13, 13a) has a Ge composition ratio that increases within the layer from a first level to a second level greater than the first level.

5. A method according to claim 1, wherein at least the first SiGe layer (13) is annealed at an elevated temperature in order to substantially fully relieve the strain in the layer (13).

6. A method according to claim 5, wherein the growth of the first and second SiGe layers (13, 13a) is carried out at a temperature in the range from room temperature to 1200° C., and the annealing of at least the first SiGe layer (13) is carried out at an elevated temperature in the range from room temperature to 1500° C.

7. A method according to claim 6, wherein the growth of the first and second SiGe layers (13, 13a) is carried out at a temperature in the range from 350 to 900° C.

8. A method according to claim 6, wherein the annealing of at least the first SiGe layer (13) is carried out at an elevated temperature in the range from 500 to 1200° C.

9. A method according to claim 1, wherein the first and second SiGe layers (13, 13a) are formed by a single continuous growth process.

10. A method according to claim 1, wherein intermediate processing is conducted between the growth of the first SiGe layer (13) and the growth of the second SiGe layer (13a).

11. A method according to claim 10, wherein the intermediate processing incorporates a step of annealing the first SiGe layer (13) at an elevated temperature in order to substantially fully relieve the strain in the first SiGe layer (13).

12. A method according to claim 10, wherein the intermediate processing step incorporates a chemo-mechanical polishing step.

13. A method according to claim 1, wherein the first SiGe layer (13) is grown by a selective epitaxial growth process.

14. A method according to claim 13, wherein the epitaxial growth process is chemical vapour deposition (CVD).

15. A method according to claim 13, wherein the epitaxial growth process is molecular beam epitaxy (MBE).

16. A method according to claim 1, wherein the strips (11) of Si oxide have a thickness in the range of 10 nm to 1000 nm.

17. A method according to claim 16, wherein the strips (11) of Si oxide have a thickness in the range from 400 nm to 700 nm.

18. A method according to claim 1, wherein the strips (11) of Si oxide have a width in the range from 100 nm to 10 μm.

19. A method according to claim 18, wherein the strips (11) of Si oxide have a width of about 1 μm.

20. A method according to claim 1, wherein the strips (11) of Si oxide are spaced apart by a distance in the range from 100 nm to 100 μm.

21. A method according to claim 20, wherein the strips (11) of Si oxide are spaced apart by a distance in the range from 5 μm to 20 μm.

22. A method according to claim 1, further comprising the step of growing on top of the first and second SiGe layers (13, 13a) a strained Si layer within which one or more semiconductor devices are formed.

23. A method according to claim 1, wherein the isolating means comprises spaced parallel walls (2; 11) of Si oxide on the Si surface.

24. A method according to claim 1, wherein the isolating means comprises spaced parallel trenches in the Si surface.

25. A method according to claim 1, wherein the isolating means comprises spaced parallel walls of Si nitride on the Si surface.

26. A lattice-tuning semiconductor substrate, comprising:
   a defining unit configured to define parallel strips (12) of a Si surface by spaced parallel isolating means (2; 11) provided along opposite edges of the strips;
   a selectively growing unit configured to selectively grow a first SiGe layer (13) on the strips (12) and not on the isolating means (2; 11) between the strips, such that first dislocations (14) extend across the first SiGe layer (13) between the isolating means (2; 11) to relieve the strain in the first SiGe layer (13) in directions transverse to the isolating means (2; 11); and a growing unit configured to grow a second SiGe layer (13*a*) on top of the first SiGe layer (13) to overgrow the isolating means (2; 11) such that second dislocations (15) form within the second SiGe layer (13*a*) above the isolating means (2; 11) to relieve the strain in the second SiGe layer (13*a*) in directions transverse to the first dislocations (14).

* * * * *